(12) United States Patent
Tanaka et al.

(10) Patent No.: US 7,375,831 B2
(45) Date of Patent: May 20, 2008

(54) LINE WIDTH MEASURING METHOD, SUBSTRATE PROCESSING METHOD, SUBSTRATE PROCESSING APPARATUS AND SUBSTRATE COOLING PROCESSING UNIT

(75) Inventors: Michio Tanaka, Kumamoto (JP); Masami Yamashita, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 322 days.

(21) Appl. No.: 11/013,784

(22) Filed: Dec. 17, 2004

(65) Prior Publication Data

US 2005/0141891 A1    Jun. 30, 2005

(30) Foreign Application Priority Data

Dec. 24, 2003    (JP) .............................. 2003-426905

(51) Int. Cl.
*G01B 11/02* (2006.01)
(52) U.S. Cl. ...................... 356/636; 356/128; 356/635
(58) Field of Classification Search ................ 356/635, 356/636, 128
See application file for complete search history.

(56) References Cited

U.S. PATENT DOCUMENTS

| | | | | |
|---|---|---|---|---|
| 6,014,456 A | * | 1/2000 | Tsudaka | ...................... 382/144 |
| 6,154,563 A | * | 11/2000 | Tsudaka | ...................... 382/144 |
| 6,457,882 B2 | | 10/2002 | Ogata et al. | |
| 6,620,244 B2 | | 9/2003 | Yoshihara | |

FOREIGN PATENT DOCUMENTS

| | | |
|---|---|---|
| JP | 08-014837 | 1/1996 |
| JP | 2002-260994 | 9/2002 |
| JP | 2003-209093 | 7/2003 |

\* cited by examiner

*Primary Examiner*—Roy M Punnoose
(74) *Attorney, Agent, or Firm*—Smith, Gambrell & Russell, LLP

(57) ABSTRACT

In optical line width measurement performed using the scatterometry technique, the present invention measures the line width formed on a substrate more accurately than in the prior art. After a predetermined pattern is formed in a resist film on a substrate, the refractive index and the extinction coefficient of the resist film are measured. Based on the measured values, calculation is performed to obtain calculated light intensity distributions of reflected light reflected from a plurality of virtual patterns. The calculated light intensity distributions are stored, and their library is created. The substrate for which the refractive index and so on are measured is irradiated with light, and the light intensity distribution of its reflected light is measured. The light intensity distribution is collated with the calculated light intensity distributions in the library, so that the line width of the virtual pattern having a matching light intensity distribution is regarded as the line width of the real pattern. Since the library of the light intensity distributions of the virtual pattern is created based on the actually measured refractive index and so on after the formation of the pattern, an accurate line width matching the pattern state at the time of measuring the line width is measured.

15 Claims, 11 Drawing Sheets

FIG.8

| No | LINE WIDTH D | LIGHT INTENSITY DISTRIBUTION P |
|---|---|---|
| 1 | $D_1$ | $P_1$ |
| 2 | $D_2$ | $P_2$ |
| 3 | $D_3$ | $P_3$ |
| 4 | $D_4$ | $P_4$ |
| ⋮ | ⋮ | ⋮ |

LINE WIDTH MEASURING METHOD, SUBSTRATE PROCESSING METHOD, SUBSTRATE PROCESSING APPARATUS AND SUBSTRATE COOLING PROCESSING UNIT

BACKGROUND OF THE INVENTION

1. Field of the Invention

The present invention relates to a line width measuring method for measuring the line width of a pattern formed in a resist film on a substrate, a substrate processing method, a substrate processing apparatus, and a substrate cooling processing unit.

2. Description of the Related Art

In a photolithography step in a manufacturing process of a semiconductor device, a predetermined pattern is formed in a resist film on a wafer by sequentially performing a plurality of treatments and processing, for example, a resist coating treatment to form the resist film by applying a resist solution onto the wafer surface, exposure processing to expose the wafer to light by applying light through the predetermined pattern onto the resist film on the wafer, a developing treatment to selectively dissolve the exposed resist film by a developing solution, and so on.

After the pattern is formed on the wafer, line width measurement of measuring the line width of the pattern is performed to check whether the pattern is properly formed.

For the line width measurement, an optical line width measuring method of measuring the line width using light is used in recent years. The optical line width measuring method is excellent in that it can restrain shrinkage of the pattern on the wafer because electrons never strike against the wafer, unlike an electron line width measuring method conventionally performed.

The above-described optical line width measurement is performed using the so-called scatterometry technique (Japanese Patent Laid-open No. 2002-260994 and Japanese Patent Laid-open No. 2003-209093).

The scatterometry technique means that calculation is performed to obtain a plurality of calculated light intensity distributions for a pattern in an arbitrary shape to create their library in advance, so that at the time of measurement of the line width, light is applied onto a real pattern that is an object to be measured and the intensity distribution of reflected light reflected from the pattern is measured, and the measurement result is matched to the calculated light intensity distributions in the library, whereby the line width of the pattern in the library having a matching light intensity is estimated to be the line width of the real pattern on the wafer.

In the above-described scatterometry technique, to calculate the light intensity distributions for an arbitrary pattern and create their library, optical constants such as a refractive index, an extinction coefficient, and so on of the resist film that is the material of the wafer surface are required. Therefore, in the conventional optical line width measurement, a standard refractive index and extinction coefficient of a resist material, for example, provided from a material manufacturer or the like have been used to calculate the light intensity distribution for an arbitrary pattern.

However, when the resist material is actually applied onto the wafer and a plurality of treatments and processing are performed on the wafer, the property of the resist film on the wafer to light changes. In addition, the change also differs among wafers due to slight variations in processing states. Accordingly, the optical constants of the resist film onto which light is applied when the line width is actually measured differ from those before the processing and also differ among wafers. Therefore, the light intensity distributions in the library are calculated based on values different from the optical constants of the resist film at the time of actual measurement, and accordingly the line width of the pattern decided through matching to the light intensity distributions in the library is far from accurate.

Unless the line width of the pattern is accurately measured, even if there occurs a case in which the line width of an actually formed pattern is not proper, that case cannot be detected. This may lead to manufacture of a large amount of defective wafers. Especially, in recent years, very fine pattern shapes are demanded, and defective wafers cannot be detected without more accurate line width measurement.

SUMMARY OF THE INVENTION

The present invention has been developed in consideration of the above point and has an object to provide a line width measuring method for measuring the line width more accurately in an optical line width measurement using the scatterometry technique, a method for processing a substrate such as a wafer, a substrate processing apparatus for realizing the method, and a substrate cooling processing unit.

To achieve the above object, the present invention is a method for measuring a line width of a predetermined pattern formed in a resist film on a substrate, characterized by including the steps of: measuring a predetermined optical constant of the resist film after the predetermined pattern is formed on the substrate; performing calculation using a measured value of the optical constant to obtain calculated light intensity distributions of reflected light reflected from a plurality of virtual patterns having different line widths and storing calculated results; applying light onto the real predetermined pattern on the substrate and measuring a light intensity distribution of reflected light thereof; and collating the measured light intensity distribution for the real predetermined pattern with the stored calculated light intensity distributions for the virtual patterns, and regarding a line width of the virtual pattern with a matching light intensity distribution as a line width of the real predetermined pattern. Note that spectra indicating the light intensities in order of light wavelengths are also included in the light intensity distribution.

According to the present invention, after the predetermined pattern is formed in the resist film on the substrate, the optical constant of the resist film is measured, and the measured value is used to calculate and store a plurality of light intensity distributions for virtual patterns. Then, the light intensity distribution of the predetermined pattern of the actually measured is collated with the stored light intensity distributions, and the line width of the virtual pattern with a matching light intensity distribution is regarded as the line width of the predetermined pattern. In this case, the optical constant of the resist film is measured after the formation of the pattern and reflected in the calculated light intensity distribution of the virtual patterns, and therefore even if the optical constant of the resist film changes due to varied processing conditions of substrates, for example, in a pattern formation step, the line width can be measured in response to the change. Therefore, the measurement of the line width can be performed more accurately than in the prior art in which the optical constant for use in calculating the light intensity distribution of the virtual pattern has been decided in advance to be a fixed value. Note that the optical constant may include a refractive index and an extinction coefficient.

The measurement of the optical constant of the resist film may be performed for a pattern for measurement formed on the substrate in advance. Further, the pattern for measurement may be formed within a region other than a chip formation region on the substrate.

According to another aspect of the present invention, the present invention is also applicable to a substrate processing method having a photolithography step. In this case, the optical constant of the resist film is measured after the formation of the pattern and reflected in the calculated light intensity distributions of the virtual patterns, and therefore even if the optical constant of the resist film changes during the photolithography step, the line width can be measured in response to the change. Accordingly, the line width measurement can be performed more accurately than in the prior art.

The measurement of the optical constant of the resist film and the measurement of the light intensity distribution for the predetermined pattern may be performed in different apparatuses. Further, in the photolithography step, after a developing treatment of the substrate, heating processing and cooling processing may be performed in sequence, and in the cooling processing, measurement of the optical constant of the resist film may be performed. In this case, immediately after the predetermined pattern is formed in the resist film, the optical constant of the resist film is measured. Therefore, since the optical constant is measured in a relatively early stage, the substrate can be, for example, carried into an apparatus where the light intensity distribution is measured, or can be subjected to other inspections, while the calculation is being performed using the measured optical constant to obtain the calculated light intensity distributions of the virtual patterns as described above. Consequently, a series of substrate processing with the line width measurement can be efficiently performed.

The measurement of the optical constant of the resist film and the measurement of the light intensity distribution for the predetermined pattern may be performed in the same apparatus.

After the measurement of the optical constant of the resist film, other measurement for the substrate may be performed, and then measurement of the light intensity distribution for the predetermined pattern may be performed. In this case, since the other measurement can be performed on the substrate while the light intensity distributions are being calculated using the measured value of the optical constant, a series of measuring steps including the measurement other than the line width measurement can be efficiently performed. Note that measurement for defect inspection of the substrate, film thickness measurement of the resist film on the substrate, measurement of overlay in exposure, and so on are included in the aforementioned other measurement.

According to still another aspect of the present invention, the present invention is a substrate processing apparatus for forming a predetermined pattern in a resist film on a substrate, including: an optical constant measuring mechanism for measuring a predetermined optical constant of the resist film having the predetermined pattern formed therein; a control mechanism for performing calculation using a measured value of the optical constant to obtain calculated light intensity distributions of reflected light reflected from a plurality of virtual patterns having different line widths and storing calculated results; and a light intensity distribution measuring mechanism for applying light onto the real predetermined pattern and measuring a light intensity distribution of reflected light thereof, wherein the control mechanism measures a line width of the predetermined pattern by collating the measured light intensity distribution for the real predetermined pattern with the stored calculated light intensity distributions for the virtual patterns, and regarding a line width of the virtual pattern with a matching light intensity distribution as a line width of the real predetermined pattern.

The optical constant measuring mechanism may be one measuring the optical constant for a pattern for measurement formed on the substrate. Further, the substrate processing apparatus may further include a cooling processing unit for cooling the substrate, wherein the optical constant measuring mechanism may be provided in the cooling processing unit.

According to yet another aspect of the present invention, a cooling processing unit for performing cooling processing may include an optical constant measuring mechanism for measuring an optical constant of a predetermined pattern formed in a resist film formed on a substrate.

BRIEF DESCRIPTION OF THE DRAWINGS

FIG. 8 is an explanatory view showing an example of a library of the light intensity distributions;

DETAILED DESCRIPTION OF THE INVENTION

Figure 1:
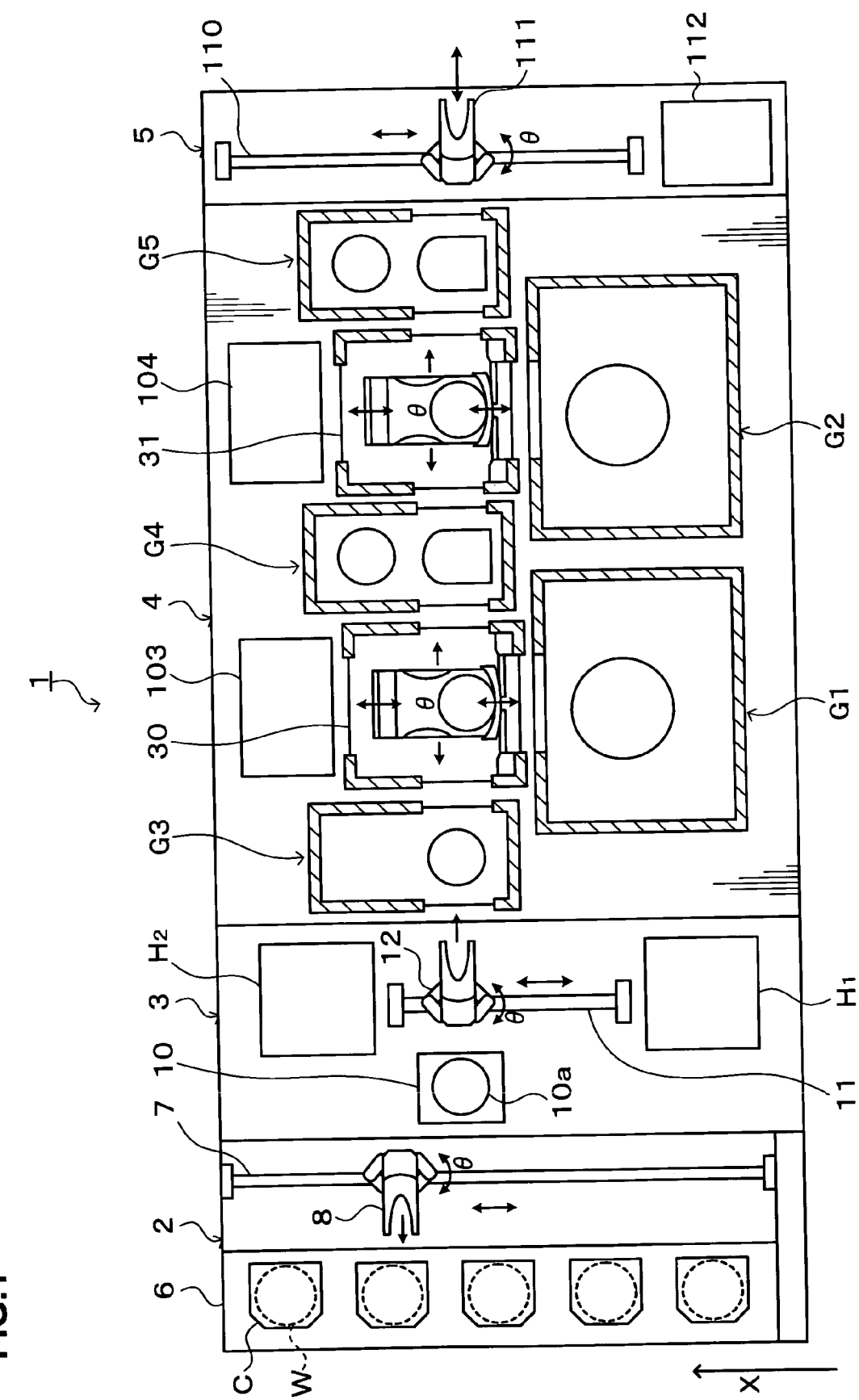
FIG. 1 is a plan view showing an outline of a configuration of a coating and developing treatment apparatus in the present embodiment.
Figure 2:
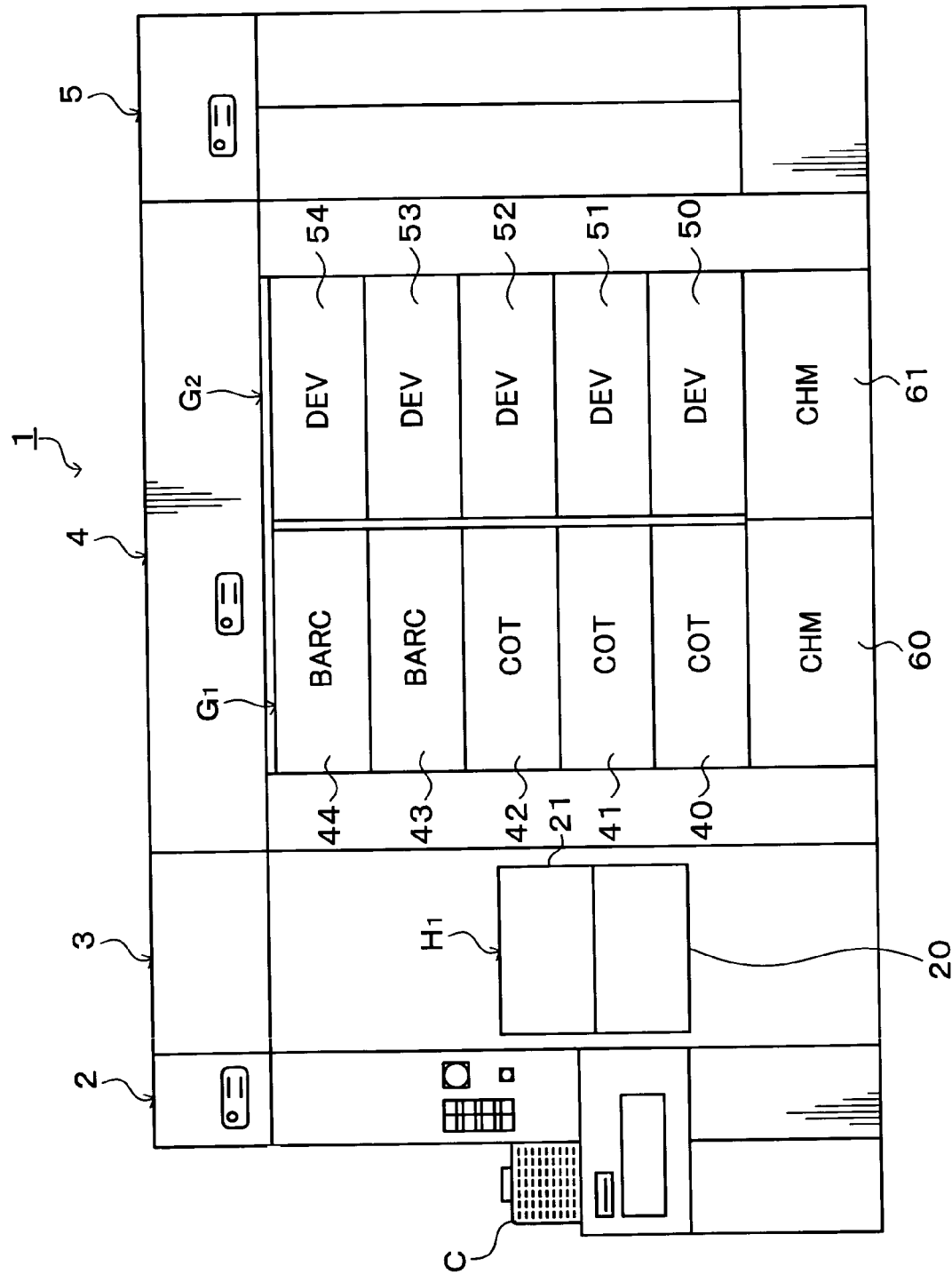
FIG. 2 is a front view of the coating and developing treatment apparatus in FIG. 1.
Figure 3:
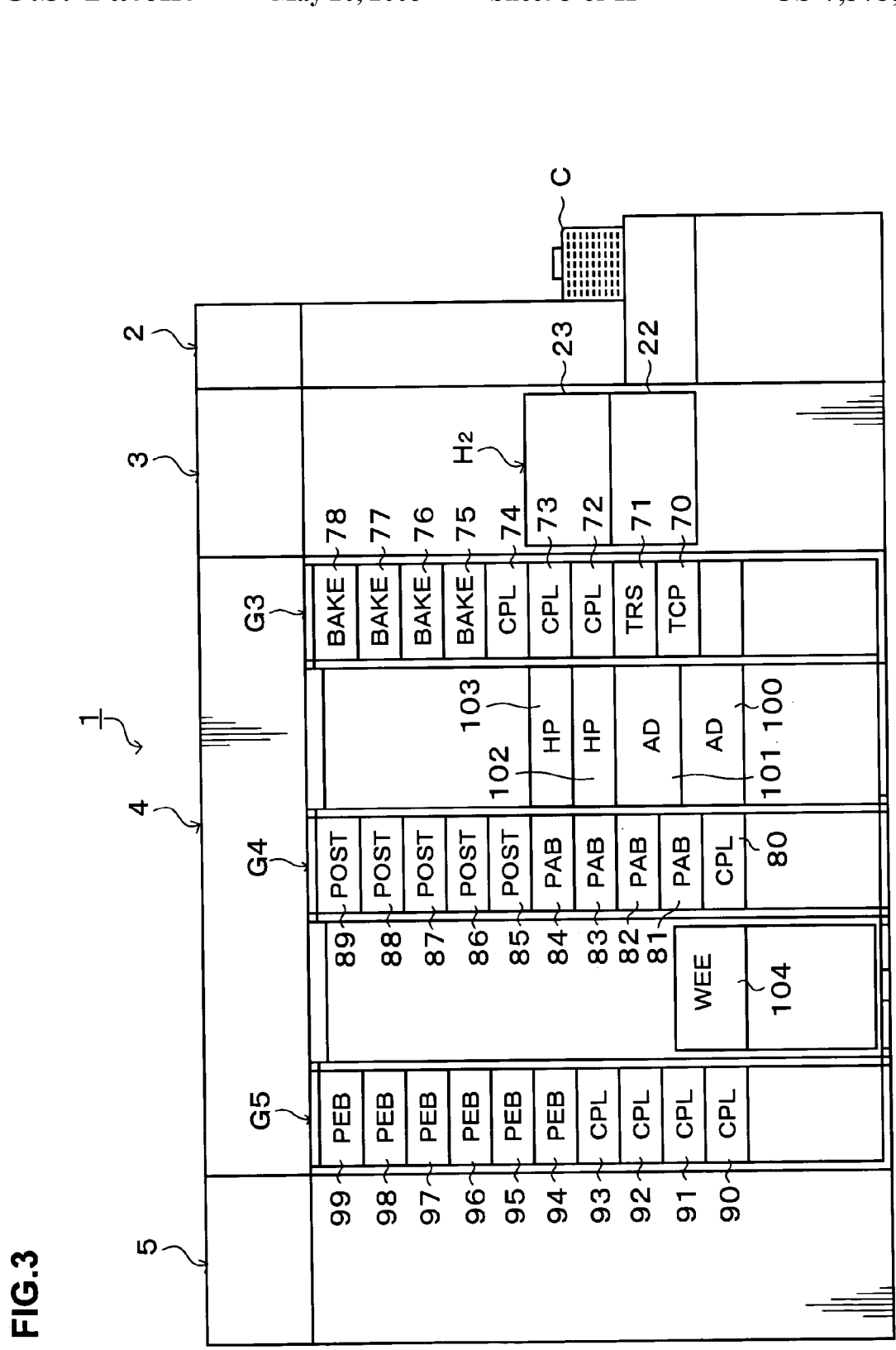
FIG. 3 is a rear view of the coating and developing treatment apparatus in FIG. 1.

Hereinafter, preferred embodiments of the present invention will be explained. FIG. 1 is a plan view showing an outline of a configuration of a coating and developing treatment apparatus 1 which performs a photolithography step of forming a predetermined pattern on a wafer, FIG. 2 is a front view of the coating and developing treatment apparatus 1, and FIG. 3 is a rear view of the coating and developing treatment apparatus 1.

As shown in FIG. 1, the coating and developing treatment apparatus 1 has, for example, a structure in which a cassette station 2 for carrying, for example, 25 wafers W per cassette, as a unit, from/to the outside into/out of the coating and developing treatment apparatus 1 and carrying the wafers W into/out of a cassette C, an inspection station 3 for performing predetermined inspection on the wafers W, a processing station 4 including a plurality of various kinds of processing units, which are multi-tiered, for performing predetermined processing on the wafers W in a manner of single wafer processing in coating and developing steps, and an interface section 5 for delivering the wafers W to/from a not-shown aligner provided adjacent to the processing station 4, are integrally connected.

In the cassette station 2, a plurality of cassettes C can be mounted at predetermined positions on a cassette mounting table 6 in a line in an X-direction (a top-to-bottom direction in FIG. 1). In the cassette station 2, a wafer carrier 8 is provided to be movable in the X-direction on a carrier path 7. The wafer carrier 8 is movable also in the vertical direction and thus can selectively access the wafers W arranged in the vertical direction in the cassette C. The wafer carrier 8 is rotatable around an axis (a θ-direction) in the vertical direction and thus can also get access to a later-described delivery section 10 on the inspection station 3 side.

The inspection station 3 includes, for example, two measuring unit groups H1 and H2 in each of which a plurality of measuring units for inspection are multi-tiered. The first measuring unit group H1 is located, for example, on the side of a negative direction in the X-direction (the lower direction in FIG. 1) in the inspection station 3, and the second measuring unit group H2 is located, for example, on the side of a positive direction in the X-direction (the upper direction in FIG. 1) in the inspection station 3. On the cassette station 2 side in the inspection station 3, the delivery section 10 is located for delivering the wafer W to/from the cassette station 2. The delivery section 10 is provided with a mounting part 10*a* on which, for example, the wafer W is mounted. Between the first measuring unit group H1 and the second measuring unit group H2, a wafer carrier apparatus 12 is provided which is movable along the X-direction, for example, on a carrier path 11. The wafer carrier apparatus 12 is, for example, movable in the vertical direction and also rotatable in the θ-direction to be able to get access to later-described measuring units in the measuring unit groups H1 and H2, the delivery unit 10, and later-described processing units in a third processing unit group G3 on the processing station 4 side.

In the first measuring unit group H1, a line width measuring unit 20 for measuring the line width of a pattern formed on the wafer W and a defect inspecting unit 21 for inspecting the wafer for defects on its surface are two-tiered in order from the bottom, for example, as shown in FIG. 2.

In the second measuring unit group H2, a film thickness measuring unit 22 for measuring the film thickness of a film on the wafer W and an overlay measuring unit 23 for measuring the deviation in overlay in exposure are two-tiered in order from the bottom, for example, as shown in FIG. 3.

The processing station 4 includes, for example, five processing unit groups G1 to G5, as shown in FIG. 1, in each of which a plurality of processing units are multi-tiered. On the side of the negative direction in the X-direction (the lower direction in FIG. 1) in the processing station 4, the first processing unit group G1 and the second processing unit group G2 are placed in order from the inspection station 3 side. On the side of the positive direction in the X-direction (the upper direction in FIG. 1) in the processing station 4, the third processing unit group G3, the fourth processing unit group G4, and the fifth processing unit group G5 are placed in order from the inspection station 3 side. Between the third processing unit group G3 and the fourth processing unit group G4, a first carrier unit 30 is provided. The first carrier unit 30 can selectively get access and carry the wafer W to the first processing unit group G1, the third processing unit group G3, and the forth processing unit group G4. Between the fourth processing unit group G4 and the fifth processing unit group G5, a second carrier unit 31 is provided. The second carrier unit 31 can selectively get access and carry the wafer W to the second processing unit group G2, the fourth processing unit group G4, and the fifth processing unit group G5.

As shown in FIG. 2, in the first processing unit group G1, solution treatment units for supplying a predetermined treatment solution onto the wafer W to thereby perform treatment, for example, resist coating units 40, 41, and 42 each for applying a resist solution onto the wafer W, and bottom coating units 43 and 44 each for forming an anti-reflection film which prevents reflection of light during exposure processing, are five-tiered in order from the bottom. In the second processing unit group G2, solution treatment units, for example, developing treatment units 50 to 54 each for developing the wafer W are five-tiered in order from the bottom. Further, chemical chambers 60 and 61 each for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, for example, a temperature regulating unit 70, a transition unit 71 for passing the wafer W, high-precision temperature regulating units 72 to 74 each for heating the wafer W under temperature control with a high precision, and high-temperature thermal processing units 75 to 78 each for heating the wafer W at a high temperature, are nine-tiered in order from the bottom.

In the fourth processing unit group G4, for example, a high-precision temperature regulating unit 80, pre-baking units 81 to 84 each for heating the wafer W after the resist coating treatment, and post-baking units 85 to 89 each for heating the wafer W after the developing treatment are ten-tiered in order from the bottom.

In the fifth processing unit group G5, a plurality of thermal processing units each for thermally processing the wafer W, for example, high-precision temperature regulating unit 90 to 93, and post-exposure baking units 94 to 99 each for heating the wafer W after the exposure, are ten-tiered in order form the bottom.

As shown in FIG. 1, on the side of the positive direction in the X-direction of the first carrier unit 30, a plurality of processing units are arranged, for example, adhesion units 100 and 101 each for performing hydrophobic treatment on the wafer W and heating processing units 102 and 103 each for heating the wafer W being four-tiered in order from the bottom as shown in FIG. 3. As shown in FIG. 1, on the side of the positive direction in the X-direction of the second carrier unit 31, for example, an edge exposure unit 104 for selectively exposing only the edge portion of the wafer W is located.

In the interface section 5, as shown in FIG. 1, for example, a wafer carrier 111 moving on a carrier path 110 extending in the X-direction and a buffer cassette 112 are provided. The wafer carrier 111 is movable in the Z-direction and also rotatable in the θ-direction and thus can get access and carry the wafer W to a not-shown aligner adjacent to the interface section 5, the buffer cassette 112, and the processing unit group G5.

Figure 4:
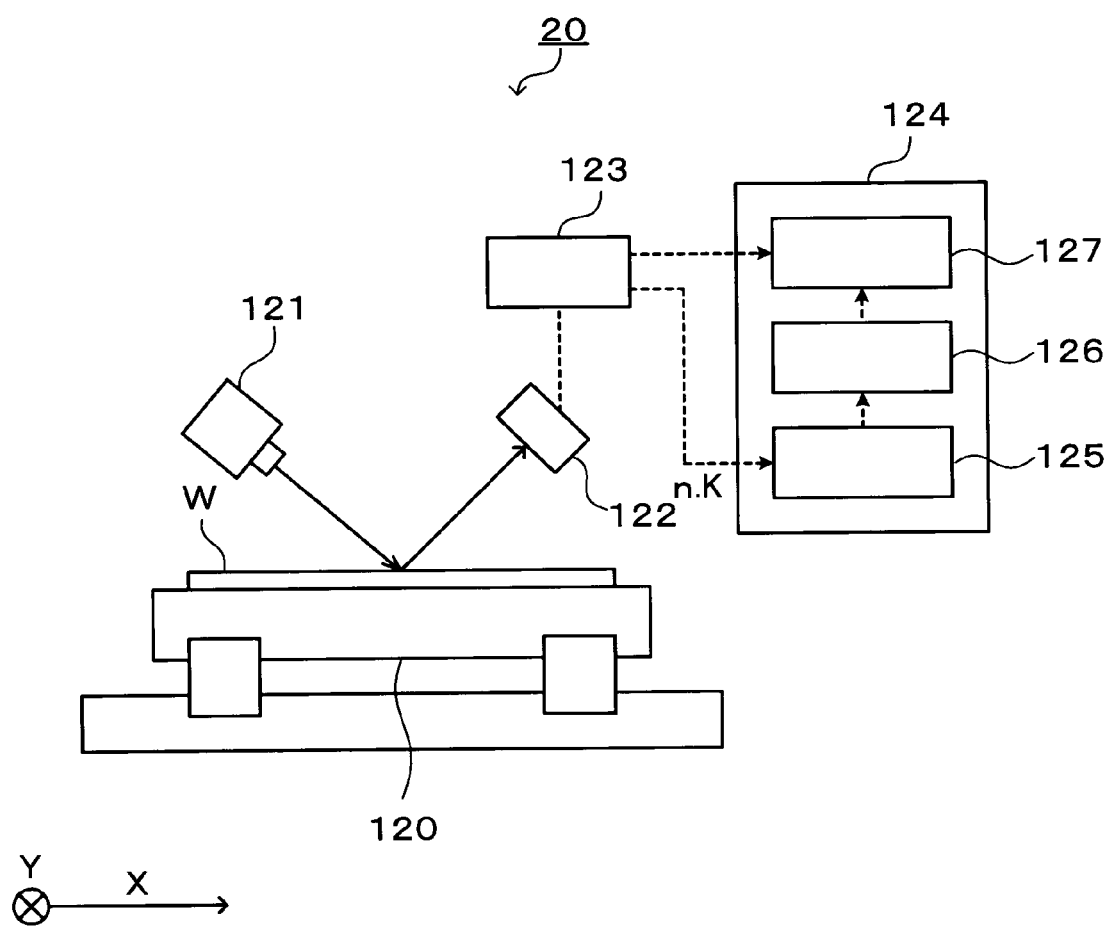
FIG. 4 is an explanatory view schematically showing an outline of a configuration of a line width measuring unit.

Next, the configuration of the above-described line width measuring unit 20 will be described in detail. FIG. 4 is a schematic diagram showing the outline of the configuration of the line width measuring unit 20.

The line width measuring unit 20 includes, for example, a mounting table 120 for horizontally mounting the wafer W thereon. The mounting table 120 constitutes, for example, an X-Y stage and can thus move in the X-direction and the Y-direction. Above the mounting table 120, a light applying part 121 applying light in a slanting direction onto the wafer W mounted on the mounting table 120, and a detecting part 122 for detecting light applied from the light applying part 121 and reflected off the wafer W are provided. The information of light detected by the detecting part 122 can be outputted to a measuring part 123. The measuring part 123 has a function of measuring the light intensity distribution of the reflected light reflected from a predetermined pattern formed on the wafer W and a function of measuring optical constants, for example, a refractive index n and an extinction coefficient k of the resist film on the wafer W. Note that the light applying part 121, the detecting part 122, and the measuring part 123 constitute a light intensity distribution measuring mechanism and an optical constant measuring mechanism.

The line width measuring unit 20 includes a control mechanism 124 for processing information to measure the line width. The control mechanism 124 has, for example, a calculating part 125, a storing part 126, and an analyzing part 127. The measured values of the refractive index n and the extinction coefficient k measured by the measuring part 123 can be outputted to the calculating part 125. The calculating part 125 can perform calculation based on the obtained measured values of the refractive index n and the extinction coefficient k and other known information such as the pattern shape, the structure, and so on inputted in advance, to obtain calculated light intensity distributions of reflected light reflected from a plurality of virtual patterns having different line widths. The storing part 126 can store the calculated light intensity distributions calculated by the calculating part 125 to create their library.

The light intensity distribution for a real pattern on the wafer W measured by the measuring part 123 can be outputted to the analyzing part 127. The analyzing part 127 can collate the light intensity distribution of the real pattern from the measuring part 123 with the light intensity distributions stored in the library of the storing part 126, select a virtual pattern having a matching light intensity distribution from the library, and estimate the line width of the virtual pattern to be the line width of the real pattern. As described above, the control mechanism 124 can calculate the plurality of light intensity distributions for virtual patterns using the refractive index n and the extinction coefficient k of the resist film measured after the formation of the pattern, and store the results therein to create the library of the light intensity distributions. The control mechanism 124 can further determine the line width of the pattern on the wafer W by matching the light intensity distribution for the real pattern on the wafer W with the light intensity distributions in the library and estimating the line width of a matched virtual pattern to be the line width of the real pattern.

The process of the line width measurement performed in the coating and developing treatment apparatus 1 configured as described above will be described together with the process of wafer processing of forming a predetermined pattern on the wafer W.

First, a single wafer W is taken out by the wafer carrier 8 from the cassette C on the cassette mounting table 6 and delivered to the delivery section 10 in the inspection station 3. The wafer W delivered to the delivery section 10 is carried by the wafer carrier apparatus 12 to the temperature regulating unit 70 included in the third processing unit group G3 in the processing station 4. The wafer W carried to the temperature regulating unit 70 is temperature-regulated and then carried by the first carrier unit 30, for example, to the bottom coating unit 43 in which an anti-reflection film is formed on the wafer W, and the wafer W is further carried in sequence to the heating processing unit 102, the high-temperature thermal processing unit 75, and the high-precision temperature regulating unit 80, in each of which the wafer W is subjected to predetermined processing.

Figure 5:
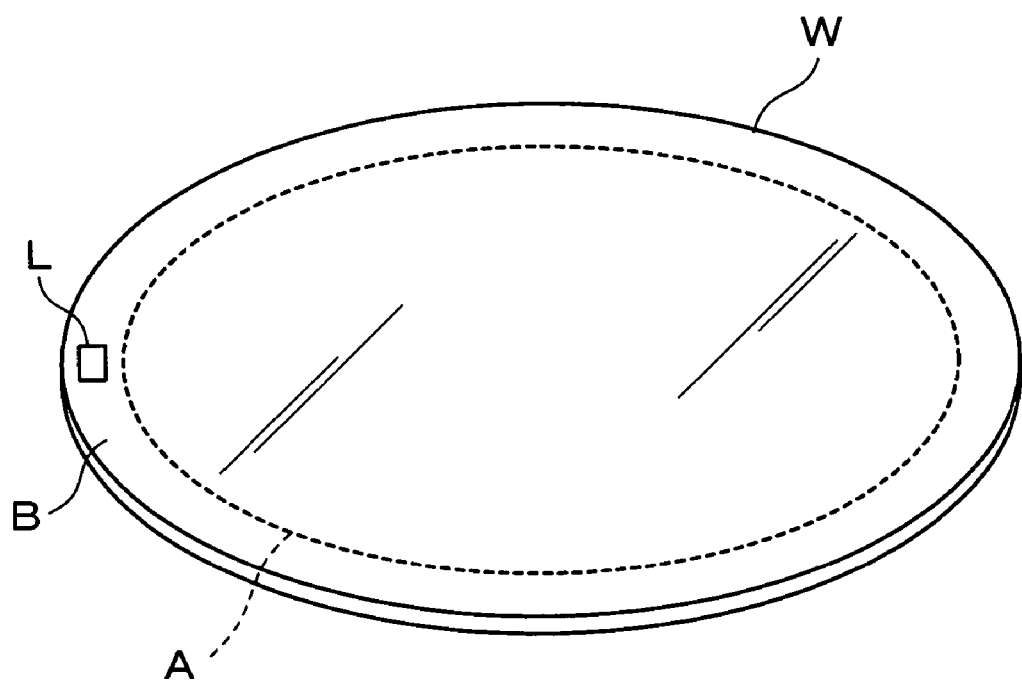
FIG. 5 is a perspective view of a wafer on which a pattern for measurement is formed.

Thereafter, the wafer W is carried by the first carrier unit 30 to the resist coating unit 40 in which a resist film is formed on the wafer W. The wafer W on which the resist film is formed is carried to the pre-baking unit 81 in which it is subjected to heating processing, and then carried in sequence by the second carrier unit 31 to the edge exposure unit 104 and the high-precision temperature regulating unit 93, in each of which the wafer W is subjected to predetermined processing. Thereafter, the wafer W is carried by the wafer carrier 111 via the interface section 5 to the not-shown aligner in which a predetermined pattern is exposed on the resist film. In this event, the exposure of the wafer W is performed such that a pattern L for measurement for measuring the refractive index n and the extinction coefficient k of the resist film is formed within a region B other than a chip formation region A on the wafer W as shown in FIG. 5. The wafer W for which the exposure processing has been finished is returned via the interface section 5 into the processing station 4. The wafer W is carried in sequence by the second carrier unit 31 to the post-exposure baking unit 94 and the high-precision temperature regulating unit 91, in each of which the wafer W is subjected to predetermined processing, and then the wafer W is carried into the developing treatment unit 50 and subjected to a developing treatment. The developing treatment selectively dissolves the resist film to form a predetermined pattern in the resist film on the wafer W. In this event, for example, a flat pattern L for measurement is formed within the region B on the wafer W shown in FIG. 5.

The wafer W for which the developing treatment has been finished is carried to the post-baking unit 85 and subjected to heating processing, and then carried to the high-precision temperature regulating unit 72 and subjected to cooling processing. Thereafter, the wafer W is carried by the wafer carrier apparatus 12 from, for example, the transition unit 71 to the line width measuring unit 20 included in the first measuring unit group H1 of the inspection station 3. Thereafter, the wafer W is carried in sequence by the wafer carrier apparatus 12 into, for example, the defect inspecting unit 21, the film thickness measuring unit 22, and the overlay measuring unit 23, in each of which the wafer W is subjected to predetermined measurement or inspection. The wafer W for which the inspection in the inspection station 3 has been finished is delivered by the wafer carrier apparatus 12 to the delivery section 10 from which the wafer W is returned by the wafer carrier 8 into the cassette C, with which a series of processes in the coating and developing treatment apparatus 1 comes to an end.

Figure 6:
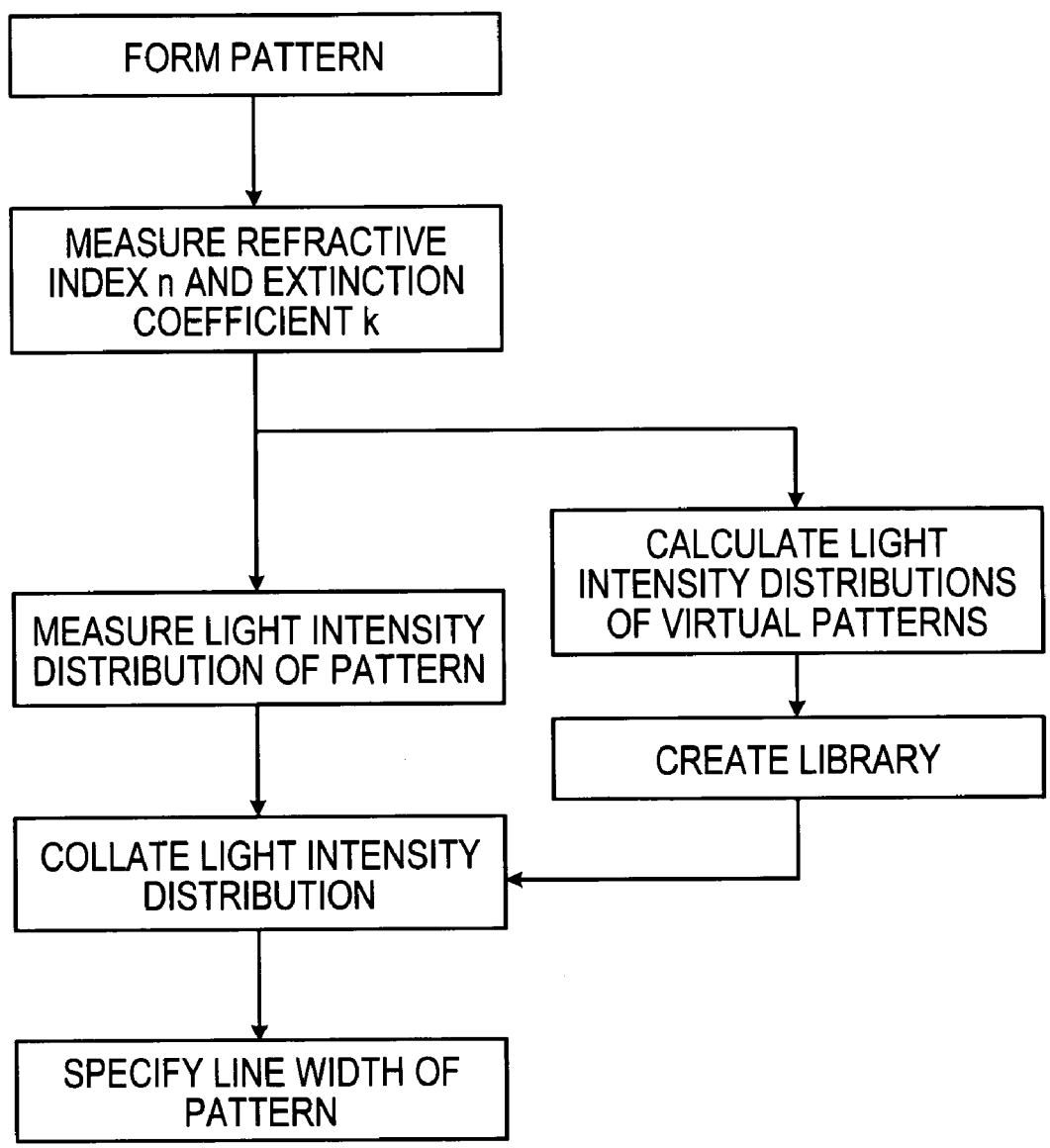
FIG. 6 is a flowchart of a line width measurement process.
Figure 7:
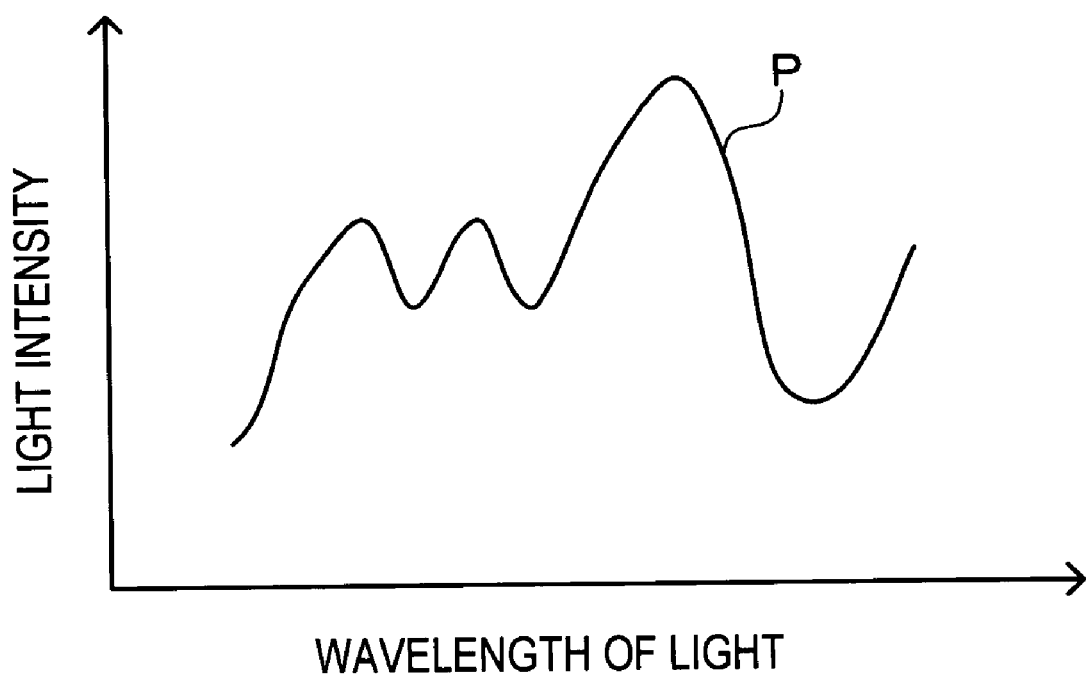
FIG. 7 is an explanatory view showing an example of a calculated light intensity distribution of a virtual pattern.

Next, the process of line width measurement performed in the above-described line width measuring unit 20 will be described in detail. FIG. 6 shows a flow of the line width measurement process. When the wafer W on which the predetermined pattern is formed is carried into the line width measuring unit 20, the wafer W is mounted on the mounting table 120. When the wafer W is mounted on the mounting table 120, the mounting table 120 moves in the X-direction and the Y-direction, whereby the wafer W is aligned so that the pattern L for measurement on the wafer W is located within the application region of light applied from the light applying part 121. Thereafter, light is applied onto the pattern L for measurement from the light applying part 121, and its reflected light is detected by the detecting part 122. The detected information is outputted to the measuring part 123 and processed, in which the refractive index n and the extinction coefficient k of the pattern on the wafer W are measured. The measured values of the refractive index n and the extinction coefficient k are outputted to the calculating part 125 of the control mechanism 124. The calculating part 125 calculates a light intensity distribution P as shown in FIG. 7 for a predetermined virtual pattern, using the measured values of the refractive index n and the extinction coefficient k. This calculated light intensity distribution P is, for example, a light intensity distribution for the wavelength of reflected light assumed when light is applied to a virtual pattern, which is calculated, for example, for a plurality of virtual patterns having different line widths.

When the light intensity distributions P for the plurality of virtual patterns are calculated in the calculating part 125, the calculated results are stored in the storing part 126. The storing part 126 creates a library in which, for example, a line width D of each virtual pattern and the calculated light intensity distribution P of the virtual pattern are stored in a corresponding manner as shown in FIG. 8.

While calculation of the calculated light intensity distributions P and the creation of their library are being performed in the control mechanism 124, the mounting table 120 moves in the line width measuring unit 20, whereby the wafer W is aligned so that the chip formation region A on the wafer W is located within the application region of the light applying part 121. Thereafter, light is applied form the light applying part 121 onto the chip formation region A on the wafer W, and its reflected light is detected by the detecting part 122. The detected information is outputted to the measuring part 123 and processed, whereby a light intensity distribution R for the real pattern on the wafer W is measured.

When the light intensity distribution R of the real pattern on the wafer W is measured, the measurement result is outputted to the analyzing part 127 of the control mechanism 124. In the analyzing part 127, the real light intensity distribution R is collated with the calculated light intensity distributions P in the library stored in the storing part 126, so that a virtual pattern having a matching light intensity distribution is specified. The line width of the specified virtual pattern is estimated to be the line width of the real pattern on the wafer W, whereby the line width of the pattern is specified.

Thereafter, for example, when the measured line width falls within a predetermined threshold value, the wafer processing in the coating and developing treatment apparatus 1 is continued. When the line width exceeds the threshold value, the setting of processing affecting the line width in the coating and developing treatment apparatus 1, for example, the heating temperature and the heating period in the post-exposure baking unit 94, the developing period and the concentration of the developing solution in the developing treatment unit 50, and so on are adjusted.

According to the above embodiment, calculation is performed using the actually measured values of the refractive index n and the extinction coefficient k to obtain the calculated light intensity distributions P for the virtual patterns and to create their library, so that the light intensity distribution R of the real pattern is collated with the library to specify the line width. Therefore, for example, even if the optical constants of the resist film change during the processing of the wafer W resulting from the variation in processing conditions in the coating and developing treatment apparatus 1, a library corresponding to the change is created, whereby more accurate measurement of the line width can be performed.

In addition, since the pattern L for measurement of the refractive index n and the extinction coefficient k is formed within the region B other than the chip formation region A on the wafer W, the measurement of the optical constants of the resist film can be performed accurately and easily irrespective of the shape of the pattern within the chip formation region on the wafer W.

Figure 9:
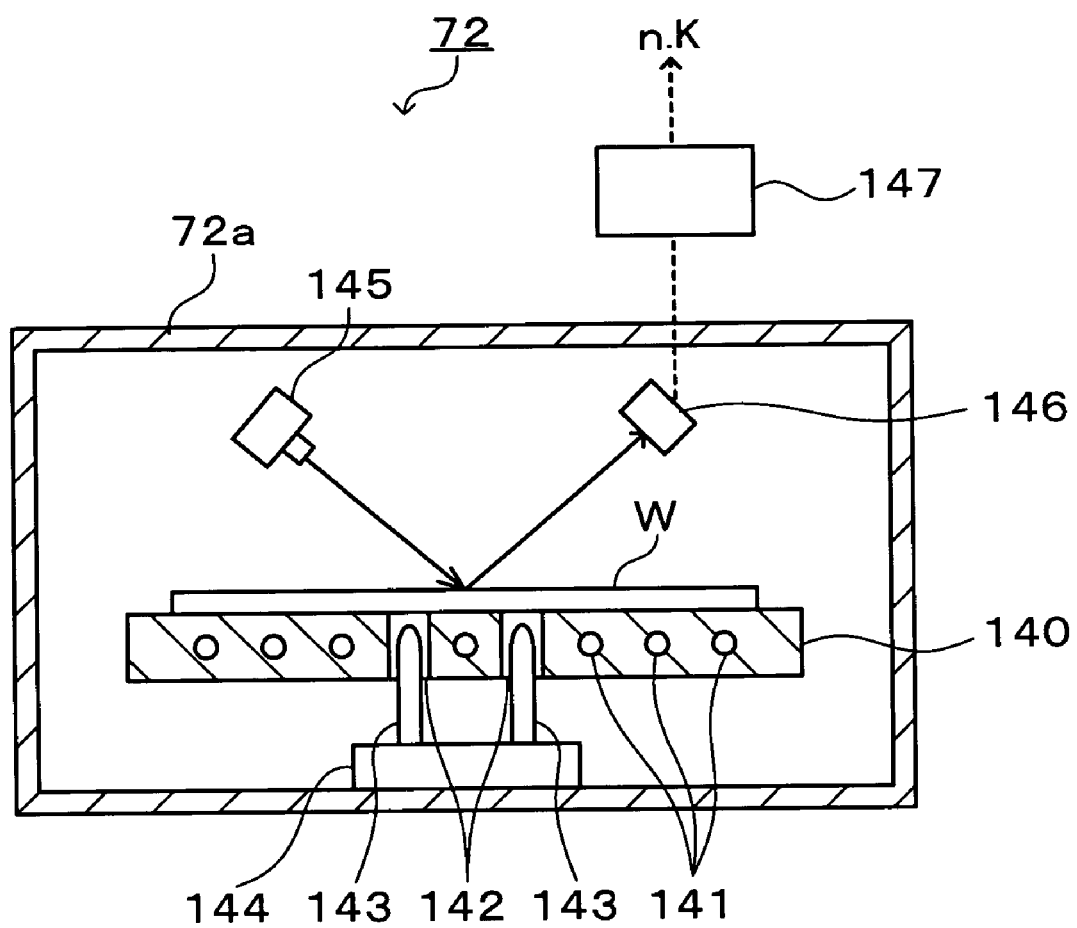
FIG. 9 is an explanatory view of a longitudinal section showing an outline of a configuration of a high-precision temperature regulating unit with a measuring mechanism of an optical constant.

Although the measurement of the refractive index n and the extinction coefficient k and the measurement of the light intensity distribution R are performed in the same unit in the above embodiment, they may be performed in different units. For example, a mechanism for measuring the refractive index n and the extinction coefficient k may be provided in the high-precision temperature regulating unit 72 as a cooling processing unit in which the cooling processing after the post-baking is performed. In this case, the high-precision temperature regulating unit 72 includes, for example, a cooling plate 140 for cooling the wafer W in a casing 72*a* as shown in FIG. 9.

In the cooling plate 140, for example, cooling pipes 141 though which a coolant flows are embedded, so that the cooling plate 140 can maintain a predetermined temperature by passing the coolant through the cooling pipes 141. In the cooling plate 140, for example, a plurality of through holes 142 passing it through in the vertical direction are formed, and rising and lowering pins 143 are located in the through holes 142. The rising and lowering pins 143 are freely vertically movable by means of, for example, a raising and lowering drive part 144, and can receive the wafer W above the cooling plate 140 and mount it on the cooling plate 140 and raise the wafer W mounted on the cooling plate 140 and pass it to the carrier unit.

Above the cooling plate 140, for example, a light applying part 145 for applying light in a slanting direction onto the wafer W on the cooling plate 140 and a detecting part 146 for detecting reflected light reflected off the front face of the wafer W are provided. The information of the reflected light detected by the detecting part 146 can be outputted to the measuring part 147. The measuring part 147 can measure the refractive index n and the extinction coefficient k of the resist film on the wafer W from the obtained information.

To describe the process of the line width measurement in this case, first, the wafer W for which the heating processing after the developing treatment has been finished is carried to the high-precision temperature regulating unit 72, in which the wafer W is cooled on the cooling plate 140. In this event, light is applied from the light applying part 145 onto the wafer W, its reflected light is detected by the detecting part 146, and the information of the reflected light is outputted to the measuring part 147. In the measuring part 147, the refractive index n and the extinction coefficient k of the resist film are measured. Note that the measurement of the refractive index n and the extinction coefficient k in this event may be performed until after the temperature of the wafer W reaches a predetermined temperature or lower, for example, room temperatures.

The measured values of the refractive index n and the extinction coefficient k obtained in the measuring part 147 are outputted, for example, to the control mechanism 124 of the line width measuring unit 20, so that the library of the light intensity distributions P for the virtual patterns using the measured values is created in the above-described manner.

While the library is being created in the line width measuring unit 20, the wafer W for which the cooling processing has been finished in the high-precision temperature regulating unit 72 is carried in sequence, for example, to other units in the inspection station 3, for example, the defect inspecting unit 21, the film thickness measuring unit 22, and the overlay measuring unit 23, in each of which the wafer W is subjected to predetermined measurement or inspection. Thereafter, the wafer W is carried to the line width measuring unit 20, in which the light intensity distribution R for the real pattern on the wafer W is measured and the light intensity distribution R is collated with the calculated light intensity distributions P in the library as described above, whereby the line width is specified.

In this case, since the refractive index n and the extinction coefficient k are measured in the high-precision temperature regulating unit 72 in which the last processing is performed for forming the predetermine pattern on the wafer W, the measurement of the optical constants is performed at a relatively early stage. Accordingly, while the library is being created in the line width measuring unit 20, other measurement or inspection can be performed for the wafer W. As a result of this, the period of creating the library is efficiently utilized, leading to efficient measurement and inspection for the wafer W and improved processing efficient in the coating and developing treatment apparatus 1.

Figure 10:
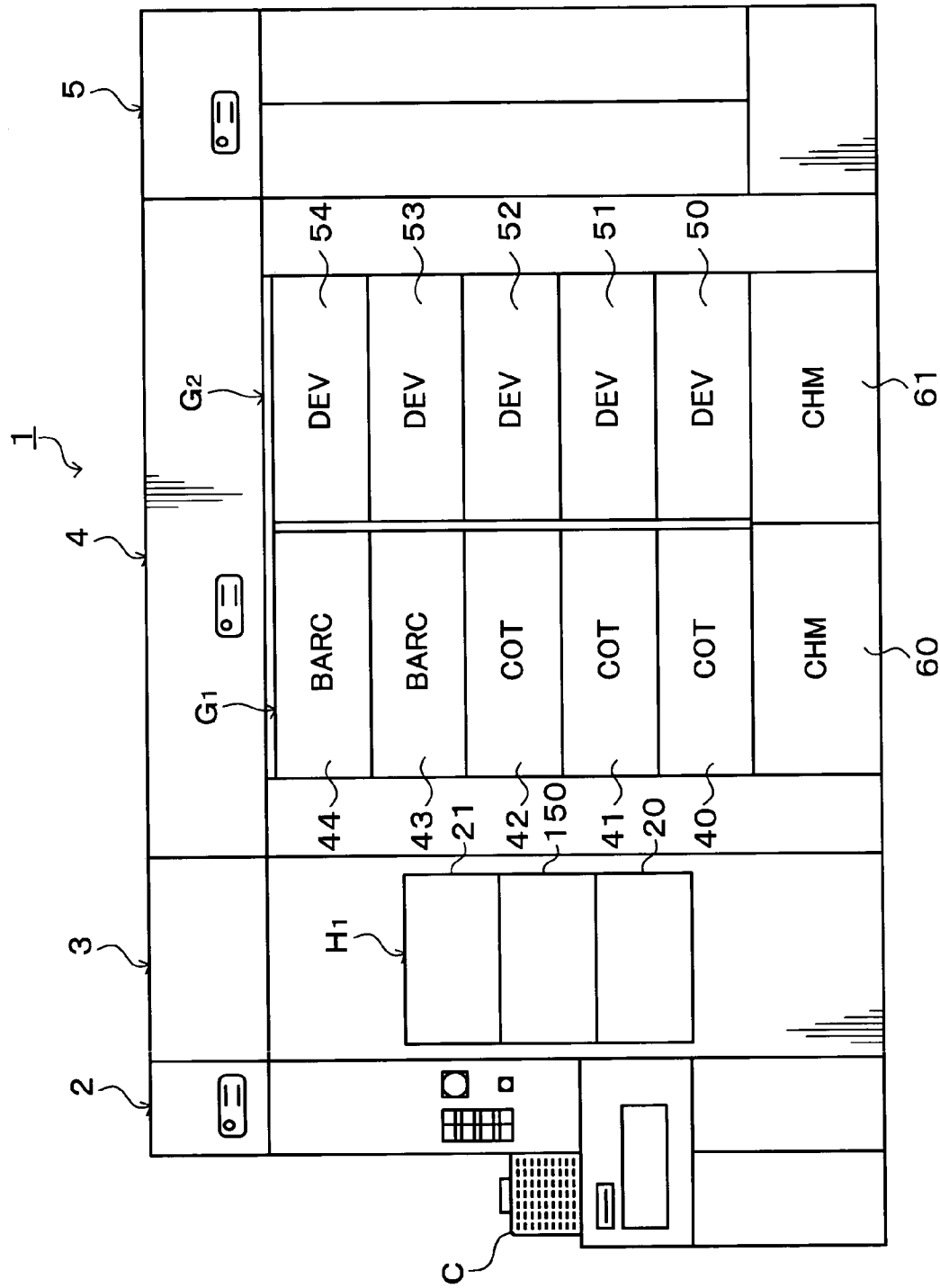
FIG. 10 is a front view of a coating and developing treatment apparatus with an optical constant measuring unit.

Note that the measurement of the optical constants of the resist film may be performed not only in the high-precision temperature regulating unit 72 but also in another unit in the coating and developing treatment apparatus 1. For example, a mechanism for measuring the optical constants of the resist film may be installed in other high-precision temperature regulating units 73, 74 and the like in the processing station 4. Alternatively, an optical constant measuring unit 150 exclusively used for measuring optical constants of the resist film may be provided in the first measuring unit group H1 in the inspection station 3 as shown in FIG. 10. In this case, the optical constant measuring unit 150 may be located between the line width measuring unit 20 and the defect inspecting unit 21 in the first measuring unit group H1. Then, the wafer W may be carried to the optical constant measuring unit 150 in which the refractive index n and the extinction coefficient k are measured and then subjected to other measurement and inspection in the defect inspecting unit 21, the film thickness measuring unit 22, and so on, and thereafter the light intensity distribution may be measured to specify the line width in the line width measuring unit 20. Alternatively, the wafer W may be carried from the optical constant measuring unit 150 directly to the line width measuring unit 20 in which the line width may be specified.

Figure 11:
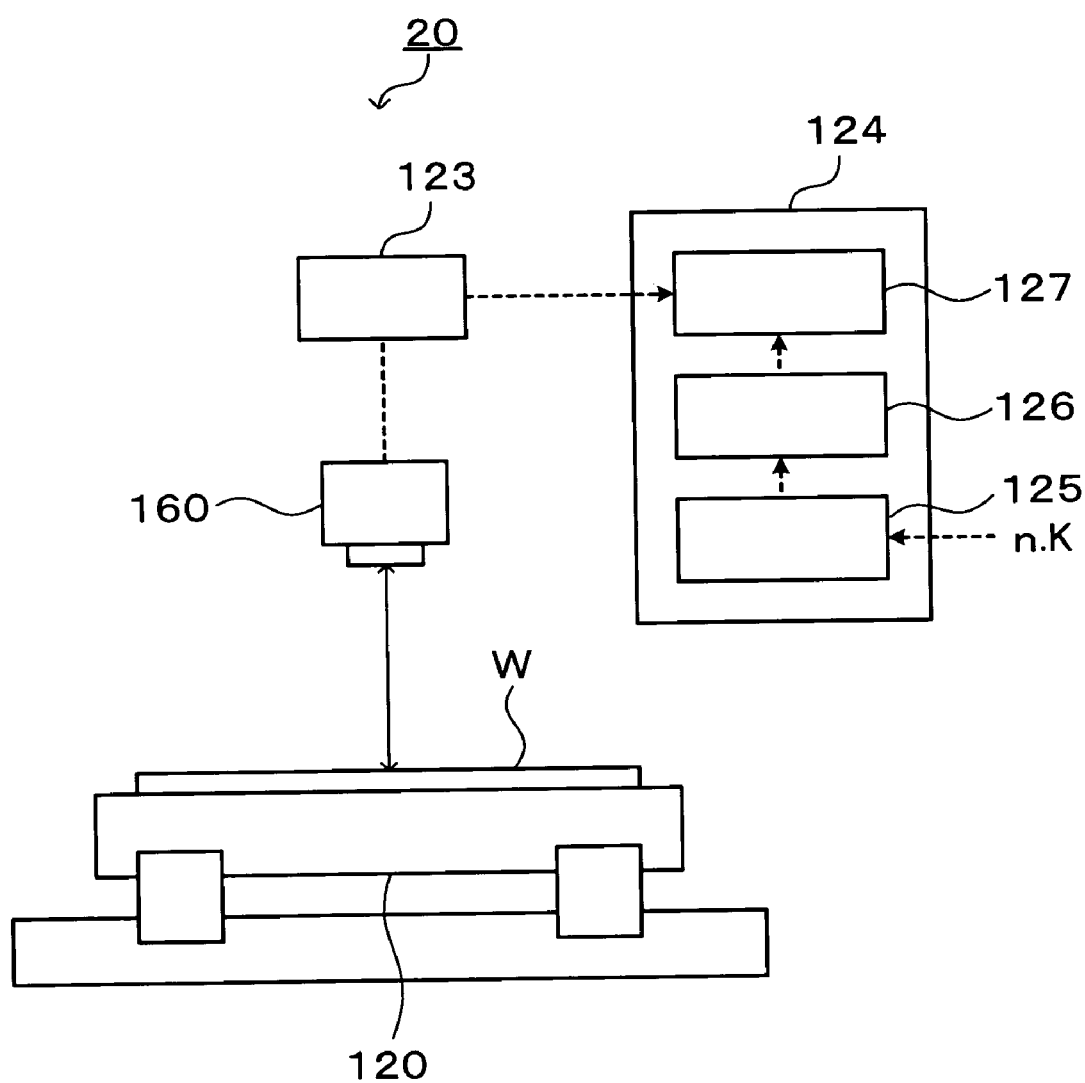
FIG. 11 is an explanatory view showing an outline of a configuration of a line width measuring unit which applies light in a vertical direction.

When it is only required for the line width measuring unit 20 to have a function of measuring the light intensity distribution R for the real pattern on the wafer W as in the above-described case, the line width measuring unit 20 may employ, as an optical system for detecting the light intensity distribution, for example, a detecting part 160 which applies light in the vertical lower direction toward the wafer W and detects its reflected light by itself as shown in FIG. 11. In this case, for example, the information of the reflected light detected by the detecting part 160 can be outputted to the measuring part 123, and the measuring mart 123 can measure the light intensity distribution R based on the information. This case requires a small footprint as compared to the optical system with the above-described slanting incidence, so that the occupied area of the line width measuring unit 20 can be reduced.

Although the refractive index n and the extinction coefficient k being the optical constants of each wafer W are actually measured and the actual measured values are reflected in the library of the calculated light intensity distributions P of the virtual patterns in the above-described embodiment, other data on the resist film such as the film thickness or the like may be actually measured so that the actual measured value is reflected in the library. In other words, the calculated light intensity distributions P of the virtual patterns may be obtained by performing calculation using the optical constants and other measured value such as the film thickness, and the calculated result may be used to create the library. In this case, before, for example, the wafer W having the resist film formed thereon is carried to the not-shown aligner in which the predetermined pattern is exposed on the resist film, the film thickness of the resist film may be measured and the measurement result may be used to create the library. In this case, since detailed information on the resist film of each wafer is reflected in the library, more accurate line width measurement can be performed. Note that, the film thickness measurement in this case may be performed using the film thickness measuring unit 22 or using a dedicated film thickness measuring unit separately provided in the interface section 5. Further, the film thickness measurement may be performed using, for example, a film thickness measuring mechanism provided in the edge exposure unit 104.

The above embodiment illustrates an example of the present invention, and the present invention is not limited to this example but can employ various aspects. For example, the kind and number of the measuring units and inspecting units in the inspection station 3 in the above-described embodiment may be arbitrarily selected. While the above-described embodiment is the coating and developing treatment apparatus 1 for processing the wafer W, the present invention is also applicable to other substrates, for example, an FPD (flat panel display) substrate, and a mask substrate, a reticle substrate, in addition to the wafer.

According to the present invention, the measurement of the line width formed in the resist film on the substrate can be performed more accurately, and therefore the present invention is useful when measuring the line width of the predetermined pattern formed on the substrate.

What is claimed is:

1. A line width measuring method for measuring a line width of a predetermined pattern formed in a resist film on a substrate, comprising the steps of:

measuring a predetermined optical constant of the resist film after the predetermined pattern is formed on the substrate;

performing calculation using a measured value of the optical constant to obtain calculated light intensity distributions of reflected light reflected from a plurality of virtual patterns having different line widths and storing calculated results;

applying light onto the real predetermined pattern on the substrate and measuring a light intensity distribution of reflected light thereof; and collating the measured light intensity distribution for the real predetermined pattern with the stored calculated light intensity distributions for the virtual patterns so as to specify a virtual pattern having a light intensity distribution matching the light intensity distribution for the real predetermined pattern, wherein a line width of the virtual pattern with the matching light intensity distribution is also a line width of the real predetermined pattern.

2. The line width measuring method as set forth in claim 1, wherein the optical constant comprises a refractive index and an extinction coefficient.

3. The line width measuring method as set forth in claim 1, wherein the measurement of the optical constant of the resist film is performed for a pattern for measurement formed on the substrate in advance.

4. The line width measuring method as set forth in claim 3, wherein the pattern for measurement is formed within a region other than a chip formation region on the substrate.

5. A substrate processing method having a photolithography step, wherein said photolithography step comprises the steps of:
    measuring a predetermined optical constant of a resist film after a predetermined pattern is formed in the resist film on a substrate;
    performing calculation using a measured value of the optical constant to obtain calculated light intensity distributions of reflected light reflected from a plurality of virtual patterns having different line widths and storing calculated results;
    applying light onto the real predetermined pattern on the substrate and measuring a light intensity distribution of reflected light thereof; and
    measuring a line width of the predetermined pattern by collating the measured light intensity distribution for the real predetermined pattern with the stored calculated light intensity distributions for the virtual patterns so as to specify a virtual pattern having a light intensity distribution matching the light intensity distribution for the real predetermined pattern, wherein a line width of the virtual pattern with the matching light intensity distribution is also a line width of the real predetermined pattern.

6. The substrate processing method as set forth in claim 5, wherein the optical constant comprises a refractive index and an extinction coefficient.

7. The substrate processing method as set forth in claim 5, wherein a pattern for measurement of the optical constant is formed on the substrate in said photolithography step, and wherein measurement of the optical constant of the resist film is performed for the pattern for measurement.

8. The substrate processing method as set forth in claim 5, wherein the measurement of the optical constant of the resist film and the measurement of the light intensity distribution for the predetermined pattern are performed in different apparatuses.

9. The substrate processing method as set forth in claim 5, wherein in said photolithography step, after a developing treatment of the substrate, heating processing and cooling processing are performed in sequence, and wherein in the cooling processing, measurement of the optical constant of the resist film is performed.

10. The substrate processing method as set forth in claim 5, wherein the measurement of the optical constant of the resist film and the measurement of the light intensity distribution for the predetermined pattern are performed in the same apparatus.

11. The substrate processing method as set forth in claim 5, wherein after the measurement of the optical constant of the resist film, other measurement for the substrate is performed, and then measurement of the light intensity distribution for the predetermined pattern is performed.

12. A substrate processing apparatus for forming a predetermined pattern in a resist film on a substrate, comprising:
    an optical constant measuring mechanism for measuring a predetermined optical constant of the resist film having the predetermined pattern formed therein;
    a control mechanism for performing calculation using a measured value of the optical constant to obtain calculated light intensity distributions of reflected light reflected from a plurality of virtual patterns having different line widths and storing calculated results; and
    a light intensity distribution measuring mechanism for applying light onto the real predetermined pattern and measuring a light intensity distribution of reflected light thereof,
    wherein said control mechanism is capable of measuring a line width of the predetermined pattern by collating the measured light intensity distribution for the real predetermined pattern with the stored calculated light intensity distributions for the virtual patterns so as to specify a virtual pattern having a light intensity distribution matching the light intensity distribution for the real predetermined pattern, wherein a line width of the virtual pattern with the matching light intensity distribution is also a line width of the real predetermined pattern.

13. The substrate processing apparatus as set forth in claim 12, wherein the optical constant comprises a refractive index and an extinction coefficient.

14. The substrate processing apparatus as set forth in claim 12, wherein said optical constant measuring mechanism is capable of measuring the optical constant for a pattern for measurement formed on the substrate.

15. The substrate processing apparatus as set forth in claim 12, further comprising: a cooling processing unit for cooling the substrate, wherein said optical constant measuring mechanism is provided in said cooling processing unit.

* * * * *